United States Patent
Tseng et al.

(10) Patent No.: US 12,222,405 B2
(45) Date of Patent: Feb. 11, 2025

(54) INSULATION RESISTANCE DETECTION SYSTEM FOR ELECTRIC VEHICLE AND INSULATION RESISTANCE DETECTION METHOD THEREOF

(71) Applicant: DELTA ELECTRONICS, INC., Taoyuan (TW)

(72) Inventors: Chien-Yu Tseng, Taoyuan (TW); Yu-Xiang Zheng, Taoyuan (TW); Wen-Cheng Hsieh, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 758 days.

(21) Appl. No.: 17/406,644

(22) Filed: Aug. 19, 2021

(65) Prior Publication Data

US 2022/0291294 A1 Sep. 15, 2022

(30) Foreign Application Priority Data

Mar. 12, 2021 (CN) .......................... 202110268618.6

(51) Int. Cl.
*G01R 31/52* (2020.01)
*B60L 3/00* (2019.01)
*G01R 27/02* (2006.01)
*G01R 27/18* (2006.01)

(52) U.S. Cl.
CPC ............ *G01R 31/52* (2020.01); *B60L 3/0069* (2013.01); *G01R 27/025* (2013.01); *G01R 27/18* (2013.01)

(58) Field of Classification Search
CPC .. G01R 27/025; G01R 27/18; G01R 31/1227; G01R 31/389; G01R 31/52; B60L 3/0069; H01M 10/4207; H01M 16/00; H01M 2220/20
See application file for complete search history.

(56) References Cited

U.S. PATENT DOCUMENTS

| | | | |
|---|---|---|---|
| 10,175,288 B2 * | 1/2019 | Pritelli | ................. G01R 31/006 |
| 2017/0176512 A1 | 6/2017 | Pritelli et al. | |

FOREIGN PATENT DOCUMENTS

| | | |
|---|---|---|
| CN | 107478908 A | 12/2017 |
| CN | 111650488 A | 9/2020 |
| CN | 111965428 A | 11/2020 |
| EP | 3182146 A1 | 6/2017 |

* cited by examiner

*Primary Examiner* — Jack Chiang
*Assistant Examiner* — Aric Lin
(74) *Attorney, Agent, or Firm* — MUNCY, GEISSLER, OLDS & LOWE, P.C.

(57) ABSTRACT

An insulation resistance detection system for an electric vehicle is used to detect a positive insulation resistance between a positive electrode of a battery of the electric vehicle and an equipment grounding point, and detect a negative insulation resistance between a negative electrode of the battery and the equipment grounding point. The insulation resistance detection system includes a negative detection circuit, a positive detection circuit, and a control unit. The control unit controls the negative detection circuit to be charged to generate a first capacitor voltage, and controls the positive detection circuit to be charged to generate a second capacitor voltage. The control unit determines whether the negative insulation resistance is abnormal according to the first capacitor voltage and a battery voltage of the battery, and determines whether the positive insulation resistance is abnormal according to the second capacitor voltage and the battery voltage.

10 Claims, 6 Drawing Sheets

INSULATION RESISTANCE DETECTION SYSTEM FOR ELECTRIC VEHICLE AND INSULATION RESISTANCE DETECTION METHOD THEREOF

BACKGROUND

Technical Field

The present disclosure relates to an insulation resistance detection system and an insulation resistance detection method, and more particularly to an insulation resistance detection system for an electric vehicle and an insulation resistance detection method thereof.

Description of Related Art

The statements in this section merely provide background information related to the present disclosure and do not necessarily constitute prior art.

Since electric vehicles driven by electricity power are becoming more and more popular today, the research and application of electric vehicles have also gained more and more attention. Especially in the matching application of batteries and electric vehicles, it is usually necessary to ensure that the accommodating space of the battery in the electric vehicles is well insulated to avoid battery power leakage, which may cause electric shock to personnel or continuous consumption of battery electricity. Therefore, it is necessary to use a specific instrument or circuit to measure the insulation resistance of the electric vehicle to determine the leakage.

However, the current insulation detection methods of electric vehicles usually only use resistance measurement or capacitance measurement at the detection point, and then reverse the insulation resistance value by measured voltage from the formula. The disadvantage is that it does not consider that the battery voltage changes during the use of the electric vehicle will cause the charging voltage on the capacitor to fluctuate, and this fluctuation will affect the calculation accuracy of the insulation resistance and cause the system to produce a misjudgment. Moreover, since the calculation method requires the microprocessor to calculate the insulation resistance before the impedance value can be acquired, the calculation method is more complicated and the protection mechanism of the system is slower, which cannot prevent circuit damage and protect personnel safety in time. In addition, if the main power supply is required during the detection process, frequent operations will affect the mileage of the electric vehicle.

SUMMARY

In order to solve the above-mentioned problems, the present disclosure provides an insulation resistance detection system for an electric vehicle. The insulation resistance detection system detects a positive insulation resistance between a positive electrode of a battery of the electric vehicle and an equipment grounding point, and detects a negative insulation resistance between a negative electrode of the battery and the equipment grounding point. The insulation resistance detection system includes a negative detection circuit, a positive detection circuit, and a control unit. The negative detection circuit is coupled to the battery in parallel, and includes a first charge and discharge circuit and a first current-limiting resistor. The first current-limiting resistor is coupled between the equipment grounding point and the negative electrode. The first charge and discharge circuit includes a first charge circuit and a first discharge circuit. The first charge circuit includes a first capacitor and a first switch. The first capacitor is coupled between the positive electrode and the equipment grounding point. The first switch is coupled between the positive electrode and the first capacitor. The first discharge circuit is coupled to the first capacitor in parallel. The positive detection circuit is coupled to the battery in parallel, and includes a second charge and discharge circuit and a second current-limiting resistor. The second current-limiting resistor is coupled between the equipment grounding point and the positive electrode. The second charge and discharge circuit includes a second charge circuit and a second discharge circuit. The second charge circuit includes a second capacitor and a second switch. The second capacitor is coupled between the negative electrode and the equipment grounding point. The second switch is coupled between the negative electrode and the second capacitor. The second discharge circuit is coupled to the second capacitor in parallel. The control unit periodically turns on the first charge circuit to charge the first capacitor, periodically turns on the first discharge circuit to discharge the first capacitor, periodically turns on the second charge circuit to charge the second capacitor, and periodically turns on the second discharge circuit to discharge the second capacitor. The first capacitor is charged to generate a first capacitor voltage, and the second capacitor is charged to generate a second capacitor voltage. The first charge circuit and the second discharge circuit are simultaneously turned on, the second charge circuit and the first discharge circuit are simultaneously turned on, and the first charge circuit and the second charge circuit are not simultaneously turned on. The control unit determines whether the negative insulation resistance is abnormal according to the first capacitor voltage and a battery voltage of the battery, and determines whether the positive insulation resistance is abnormal according to the second capacitor voltage and the battery voltage.

In order to solve the above-mentioned problems, the present disclosure provides an insulation resistance detection method for an electric vehicle. Adapting an insulation resistance detection system is used to detect a positive insulation resistance between a positive electrode of a battery of the electric vehicle and an equipment grounding point, and detect a negative insulation resistance between a negative electrode of the battery and the equipment grounding point. The insulation resistance detection system includes a negative detection circuit and a positive detection circuit, the negative detection circuit includes a first capacitor and the positive detection circuit includes a second capacitor. The insulation resistance detection method includes steps of: measuring a battery voltage of the battery, periodically charging and discharging the first capacitor to acquire a first capacitor voltage of the first capacitor while charging the first capacitor, periodically charging and discharging the second capacitor to acquire a second capacitor voltage of the second capacitor while charging the second capacitor, wherein periodically charging and discharging the first capacitor and the second capacitor comprising steps of: simultaneously discharging the second capacitor while charging the first capacitor, and simultaneously charging the second capacitor while discharging the first capacitor, wherein a time period of charging and a time period of discharging are the same, calculating that the negative insulation resistance is less than a first predetermined resistance range according to the first capacitor voltage and the battery voltage to determine that the negative insulation resistance is abnormal, and calculating that the positive insulation resistance is less than a second predetermined resistance range according to the second capacitor voltage and the battery voltage to determine that the positive insulation resistance is abnormal.

The main purpose and effect of the present disclosure is that the insulation resistance detection system can detect an insulation condition between the positive electrode and the negative electrode of the battery and the equipment grounding point by periodically charging and discharging the negative detection circuit and the positive detection circuit so as to prevent battery power leakage from causing electric shock to personnel, avoid continuous detection of battery electricity that affects the mileage of electric vehicles, and increase detection speed and safety.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
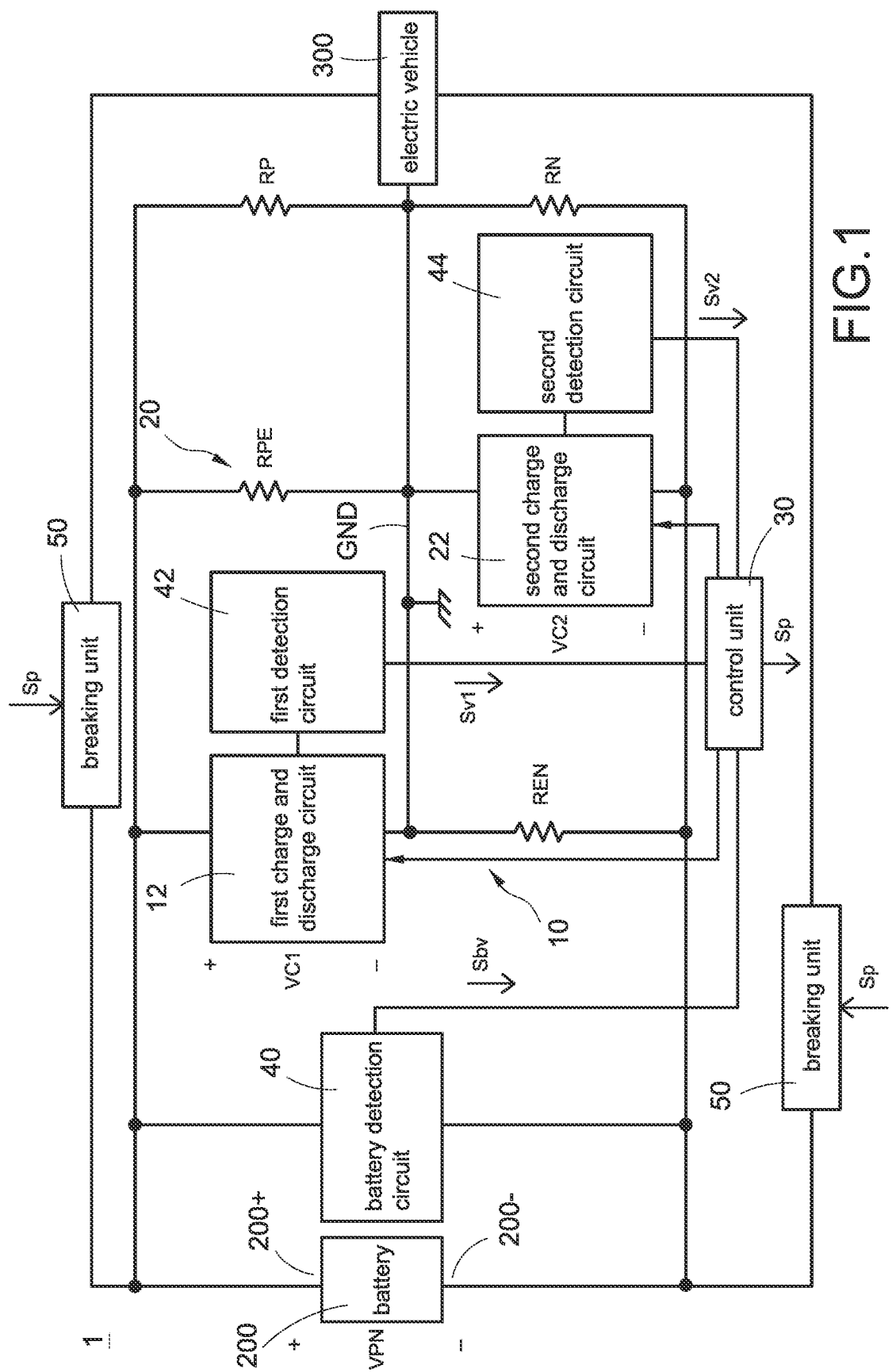
FIG. 1 is a schematic block diagram of an insulation resistance detection system for an electric vehicle according to the present disclosure.

Reference will now be made to the drawing figures to describe the present disclosure in detail. It will be understood that the drawing figures and exemplified embodiments of present disclosure are not limited to the details thereof.

Please refer to FIG. 1, which shows a schematic block diagram of an insulation resistance detection system for an electric vehicle according to the present disclosure. The insulation resistance detection system 1 is used to detect a positive insulation resistance RP between a positive electrode 200+ of a battery 200 and an equipment grounding point GND of an electric vehicle 300, and detect a negative insulation resistance RN between a negative electrode 200− of the battery 200 and the equipment grounding point GND of the electric vehicle 300. In particular, the electric vehicle 300 may be a mobile device driven by battery electricity (for example, but not limited to, an electric boat, an electric vehicle, etc.). Specifically, the battery 200 is usually installed in an accommodating space of the electric vehicle 300, such as a battery slot. Since the electricity conducting path between the battery slot and the equipment grounding point GND may cause poor insulation due to factors of environmental or time, the power electricity of the battery 200 may cause a risk of power leakage through this path after the installation of the battery 200. Therefore, the insulation resistance detection system 1 is used to detect the insulation condition between the battery 200 and the equipment grounding point GND (usually to detect the impedance from the chassis of the electric vehicle 300 to the equipment grounding point GND) to avoid the power leakage of the battery 200 caused by poor equipment insulation, which may endanger personnel and system safety.

The insulation resistance detection system 1 includes a negative detection circuit 10, a positive detection circuit 20, and a control unit 30. The negative detection circuit 10 is coupled to the battery 200 in parallel, and the negative detection circuit 10 includes a first charge and discharge circuit 12 and a first current-limiting resistor REN. The first current-limiting resistor REN is coupled between the equipment grounding point GND and the negative electrode 200− of the battery 200. The positive detection circuit 20 is coupled to the battery 200 in parallel, and the positive detection circuit 20 includes a second charge and discharge circuit 22 and a second current-limiting resistor RPE. The second current-limiting resistor RPE is coupled between the equipment grounding point GND and the positive electrode 200+ of the battery 200. The control unit 30 is coupled to the battery 200, the first charge and discharge circuit 12, and the second charge and discharge circuit 22. Each of the first charge and discharge circuit 12 and the second charge and discharge circuit 22 has a built-in capacitor. The control unit 30 controls the first charge and discharge circuit 12 to be periodically charged and discharged so that a first capacitor voltage VC1 is generated when the first charge and discharge circuit 12 charged. Also, the control unit 30 controls the second charge and discharge circuit 22 to be periodically charged and discharged so that a second capacitor voltage VC2 is generated when the second charge and discharge circuit 22 charged.

The control unit 30 determines whether the negative insulation resistance RN (between the negative electrode 200− and the equipment grounding point GND) is abnormal or not according to the first capacitor voltage VC1 and a battery voltage VPN of the battery 200. Also, the control unit 30 determines whether the positive insulation resistance RP (between the positive electrode 200+ and the equipment grounding point GND) is abnormal or not according to the second capacitor voltage VC2 and the battery voltage VPN. When the negative insulation resistance RN is abnormal, it means that the electricity conducting path between the negative electrode 200− and the equipment grounding point GND is not well insulated and the power leakage occurs. Similarly, when the positive insulation resistance RP is abnormal, it means that the electricity conducting path between the positive electrode 200+ and the equipment grounding point GND is not well insulated and the power leakage occurs.

The insulation resistance detection system 1 further includes a battery detection circuit 40, a first detection circuit 42, and a second detection circuit 44. The battery detection circuit 40 is coupled to the battery 200 and the control unit 30, and is used to detect the battery voltage VPN and provide a battery voltage signal Sbv corresponding to the battery voltage VPN to the control unit 30 so that the control unit 30 realizes the battery voltage VPN according to the battery voltage signal Sbv. The first detection circuit 42 is coupled to the first charge and discharge circuit 12, and is used to detect the first capacitor voltage VC1 and provide a first voltage signal Sv1 corresponding to the first capacitor voltage VC1 to the control unit 30 so that the control unit 30 realizes the first capacitor voltage VC1 according to the first voltage signal Sv1. The second detection circuit 44 is coupled to the second charge and discharge circuit 22, and is used to detect the second capacitor voltage VC2 and provide a second voltage signal Sv2 corresponding to the second capacitor voltage VC2 to the control unit 30 so that the control unit 30 realizes the second capacitor voltage VC2 according to the second voltage signal Sv2. In particular, the battery detection circuit 40, the first detection circuit 42, and the second detection circuit 44 may be coupled to the battery 200 in series or in parallel.

The insulation resistance detection system 1 further includes at least one breaking unit 50. The breaking unit 50 is coupled to an electricity conducting path between the battery 200 and the electric vehicle 300. For example, the breaking unit 50 is coupled to the electricity conducting path between the positive electrode 200+ and the electric vehicle 300, or is coupled to the electricity conducting path between the negative electrode 200- and the electric vehicle 300, or both (as shown in FIG. 1). The control unit 30 provides a protection signal Sp to the corresponding breaking unit(s) 50 according to the abnormality of the negative insulation resistance RN or the abnormality of the positive insulation resistance RP so that the electricity conducting path between the battery 200 and the electric vehicle 300 is disconnected through the breaking unit 50 to provide power leakage protection function. When the insulation resistance detection system 1 determines that the negative insulation resistance RN and the positive insulation resistance RP are both normal, the control unit 30 turns on the breaking unit 50 to make the battery voltage VPN of the battery 200 supply power to the electric vehicle 300.

Figure 2:
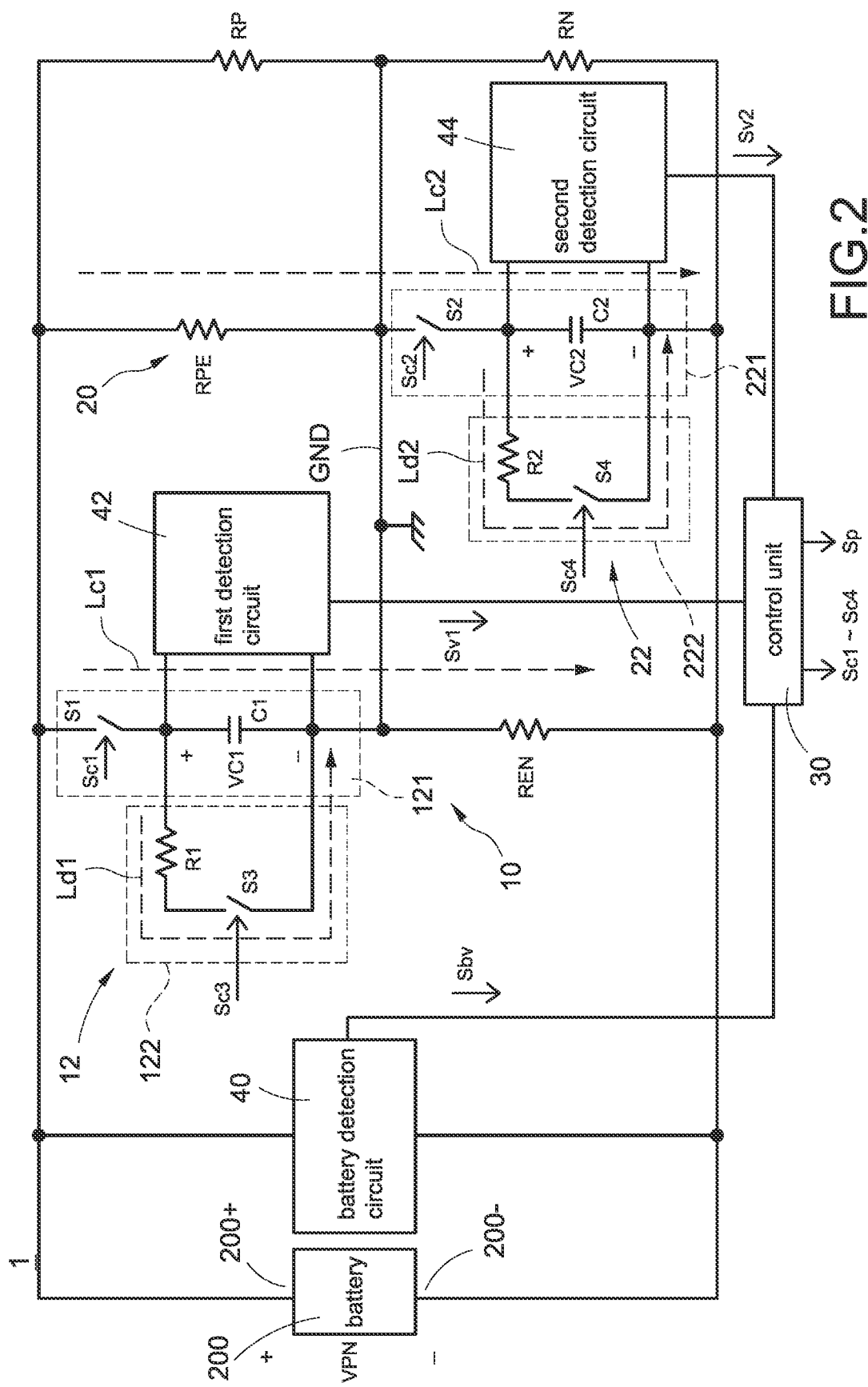
FIG. 2 is a schematic block diagram of the insulation resistance detection system according to the present disclosure.

Please refer to FIG. 2, which shows a schematic block diagram of the insulation resistance detection system according to the present disclosure, and also refer to FIG. 1, The first charge and discharge circuit 12 includes a first charge circuit 121 and a first discharge circuit 122. The first charge circuit 121 includes a first switch S1 and a first capacitor C1. The first switch S1 is coupled to the positive electrode 200+ and the first capacitor C1, and the first capacitor C1 is coupled to the first switch S1 and the equipment grounding point GND. In particular, the positions of the first capacitor C1 and the first switch S1 are interchangeable. The first discharge circuit 122 and the first detection circuit 42 are coupled to the first capacitor C1 in parallel. The second charge and discharge circuit 22 includes a second charge circuit 221 and a second discharge circuit 222. The second charge circuit 221 includes a second switch S2 and a second capacitor C2. The second switch S2 is coupled to the negative electrode 200- and the second capacitor C2, and the second capacitor C2 is coupled to the second switch S2 and the equipment grounding point GND. In particular, the positions of the second capacitor C2 and the second switch S2 are interchangeable. The second discharge circuit 222 and the second detection circuit 44 are coupled to the second capacitor C2 in parallel.

For preferred embodiments, the first discharge circuit 122 includes a third switch S3 and a first discharge resistor R1, and the second discharge circuit 222 includes a fourth switch S4 and a second discharge resistor R2. The third switch S3 is coupled to a first end of the first capacitor C1, the first discharge resistor R1 is connected to the third switch S3 in series, and the first discharge resistor R1 is coupled to a second end of the first capacitor C1. The fourth switch S4 is coupled to a first end of the second capacitor C2, the second discharge resistor R2 is connected to the fourth switch S4 in series, and the second discharge resistor R2 is coupled to a second end of the second capacitor C2. In particular, the positions of the third switch S3 and the first discharge resistor R1 are interchangeable, and the positions of the fourth switch S4 and the second discharge resistor R2 are interchangeable.

The control unit 30 provides a first control signal Sc1 to control turning on or turning off the first switch S1, and provides a second control signal Sc2 to control turning on or turning off the second switch S2, and provides a third control signal Sc3 to control turning on or turning off the third switch S3, and provides a fourth control signal Sc4 to control turning on or turning off the fourth switch S4. In particular, the first control signal Sc1 and the third control signal Sc3 are complementary to each other so that the first capacitor C1 are respectively charged and discharged. In particular, the second control signal Sc2 and the fourth control signal Sc4 are complementary to each other so that the second capacitor C2 are respectively charged and discharged. In particular, the first control signal Sc1 and the second control signal Sc2 are complementary to each other. That is, the control unit 30 simultaneously provides the first control signal Sc1 and the fourth control signal Sc4 to control the first charge circuit 121 and the second discharge circuit 222 simultaneously turning on. The control unit 30 simultaneously provides the second control signal Sc2 (complementary to the fourth control signal Sc4) and the third control signal Sc3 (complementary to the first control signal Sc1) to control the second charge circuit 221 and the first discharge circuit 122 simultaneously turning on. Therefore, the first charge circuit 121 and the second charge circuit 221 are not simultaneously turned on, which may be preferably implemented by discharging the second capacitor C2 when the first capacitor C1 is charged, and vice versa. The advantage is that the first capacitor C1 and the second capacitor C2 can be alternately charged and discharged, i.e., one is charged and the other is discharged. Accordingly, the detection speed of the insulation resistance detection system 1 can be improved, the process can be simplified, and the system energy consumption can be reduced, especially the embodiment in which the battery 200 is directly used as the power supply apparatus. In particular, each of the control signals Sc1-Sc4 may have a fixed time period so that the charging time and the discharging time of the first capacitor C1 are identical to the charging time and the discharging time of the second capacitor C2.

When the control unit 30 controls turning on the first switch S1 and turning off the third switch S3, the battery voltage VPN charges the first capacitor C1 to provide a first charge path Lc1. The first charge path Lc1 is a closed path composed of the battery 200, the first switch S1, the first capacitor C1, and the first current-limiting resistor REN. In particular, since the resistance value of the first current-limiting resistor REN may be designed to be much smaller than the resistance value of the negative insulation resistance RN (under normal condition), the current flowing through the negative insulation resistance RN may as smaller as to be negligible, i.e., it is equivalent to that there is no current path. When the control unit 30 controls turning off the first switch S1 and turning on the third switch S3, the first capacitor C1 discharges to provide a first discharge path Ld1. The first discharge path Ld1 is a closed path composed of the first capacitor C1, the first discharge resistor R1, and the third switch S3. Moreover, a second charge path Lc2 and a second discharge path Ld2 provided by the control unit 30 according to turning on or turning off of the second switch S2 and the fourth switch S4 are similar to the first charge path Lc1 and the first discharge path Ld1, and the detail description is omitted here for conciseness.

In order to prevent the insulation resistance detection system 1 from consuming too much battery voltage VPN during the detection process to cause the endurance of the electric vehicle 300 to drop too much, therefore it is necessary to reduce the current flowing from the battery 200 through the first charge and discharge circuit 12 as much as possible. At this condition, the design of the first current-limiting resistor REN must be maintained at a relatively large resistance value to reduce the current flowing through the first charge path Lc1 during insulation detection. However, it is difficult for the control unit 30 to determine whether the negative insulation resistance RN is abnormal according to the first capacitor voltage VC1 since the charging speed of the first capacitor voltage VC1 is too slow or the charging amount is too small. Therefore, the resistance value design of the first current-limiting resistor REN should not be too large, so its preferred implementation is to design the resistance value of MΩ (mega ohm) level. Moreover, since the resistance value of the first discharge resistor R1 is designed with respect to the discharging speed of the first capacitor C1, that is, the smaller the first discharge resistor R1 is (even if the first discharge resistor R1 is not installed), the faster the discharging speed of the first capacitor C1 will be. Ideally, the first capacitor C1 may be completely discharged within a predetermined time so that the charging of the first capacitor C1 in the next detection cycle starts from zero potential, which increases the detection accuracy of the insulation resistance detection system 1. However, when the resistance value of the first discharge resistor R1 is too small, the current flowing through the first discharge path Ld1 will be too large, so the current withstand specification of the third switch S3 needs to be improved, which will increase the circuit cost. Therefore, the resistance value design of the first discharge resistor R1 should not be too small, so its preferred implementation is to design the resistance value of KΩ (kilo ohm) level. Similar, the design of the second current-limiting resistor RPE and the second discharge resistor R2 is also considered in the same way. That is, a preferred embodiment of the second current-limiting resistor RPE is to design the resistance value of MΩ level, and a preferred embodiment of the second discharge resistor R2 is to design the resistance value of KΩ level, and the detail description is omitted here for conciseness.

Figure 3:
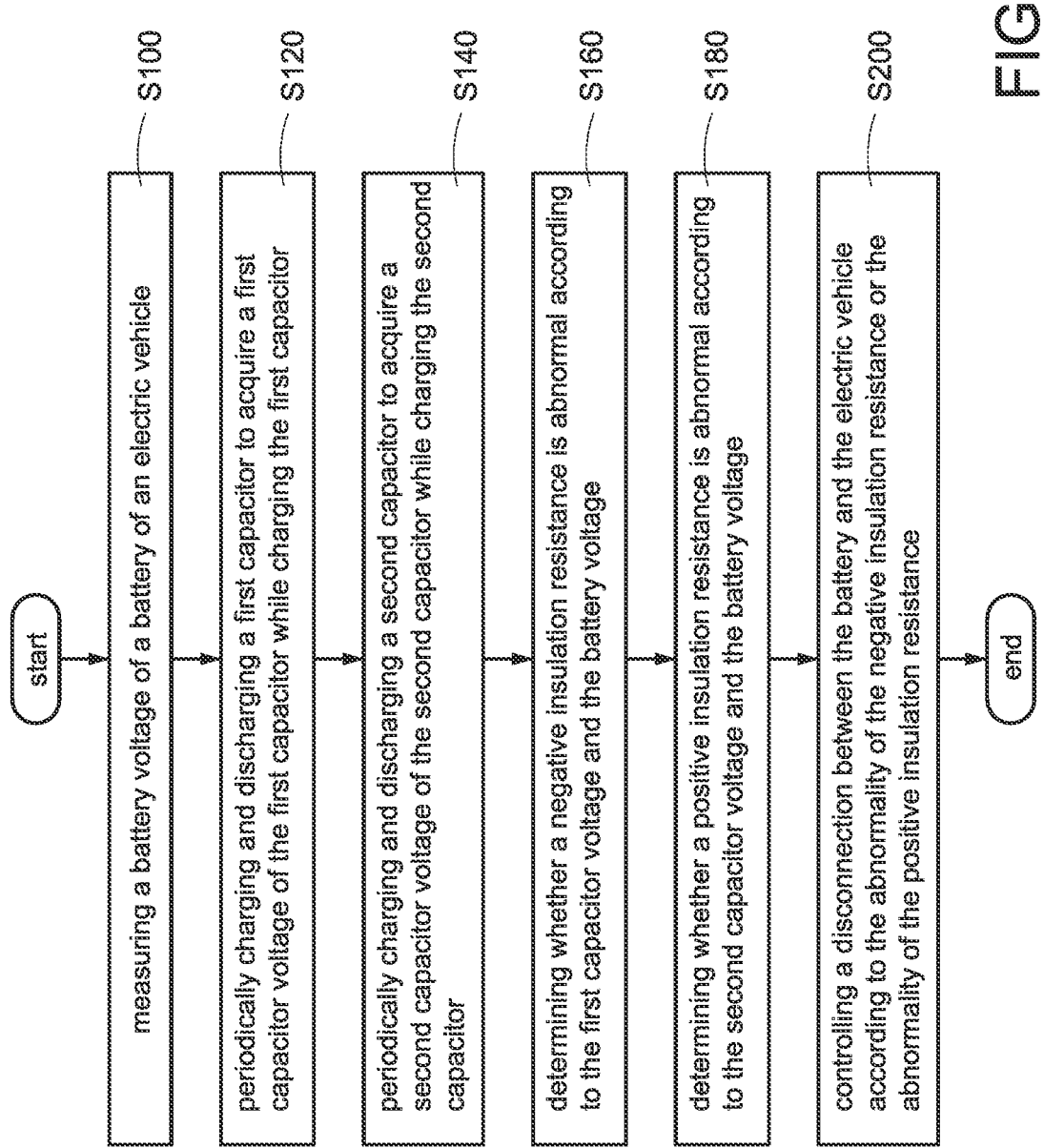
FIG. 3 is a flowchart of a method of detecting an insulation resistance of an electric vehicle according to the present disclosure.

Please refer to FIG. 3, which shows a flowchart of a method of detecting an insulation resistance of an electric vehicle according to the present disclosure, and also refer to FIG. 1 to FIG. 2. The insulation resistance detection method includes steps of: measuring the battery voltage VPN of the battery 200 of the electric vehicle 300 (S100). The control unit 30 realizes the battery voltage VPN according to the battery voltage signal Sbv measured/acquired by the battery detection circuit 40. Afterward, periodically charging and discharging the first capacitor C1 to acquire the first capacitor voltage VC1 of the first capacitor C1 while charging the first capacitor C1 (S120). The control unit 30 periodically controls turning on and turning off the first switch S1 and the third switch S3 so that the first capacitor C1 is periodically charged and discharged to generate the first capacitor voltage VC1 while the first capacitor C1 is charged. The control unit 30 realizes the first capacitor voltage VC1 according to the first voltage signal Sv1 measured by the first detection circuit 42. Afterward, periodically charging and discharging the second capacitor C2 to acquire the second capacitor voltage VC2 of the second capacitor C2 while charging the second capacitor C2 (S140). The control unit 30 periodically controls turning on and turning off the second switch S2 and the fourth switch S4 so that the second capacitor C2 is periodically charged and discharged to generate the second capacitor voltage VC2 while the second capacitor C2 is charged. The control unit 30 realizes the second capacitor voltage VC2 according to the second voltage signal Sv2 measured by the second detection circuit 44.

Afterward, determining whether the negative insulation resistance RN is abnormal according to the first capacitor voltage VC1 and the battery voltage VPN (S160). The control unit 30 determines whether the negative insulation resistance RN (between the negative electrode 200− and the equipment grounding point GND) is abnormal or not according to the first capacitor voltage VC1 and the battery voltage VPN of the battery 200. When the negative insulation resistance RN is abnormal, it means that the electricity conducting path between the negative electrode 200− and the equipment grounding point GND is not well insulated and the leakage occurs. Afterward, determining whether the positive insulation resistance RP is abnormal according to the second capacitor voltage VC2 and the battery voltage VPN (S180). The control unit 30 determines whether the positive insulation resistance RP (between the positive electrode 200+ and the equipment grounding point GND) is abnormal or not according to the second capacitor voltage VC2 and the battery voltage VPN. When the positive insulation resistance RP is abnormal, it means that the electricity conducting path between the positive electrode 200+ and the equipment grounding point GND is not well insulated and the leakage occurs. Finally, controlling a disconnection between the battery 200 and the electric vehicle 300, by the control unit 30, according to the abnormality of the negative insulation resistance RN or the abnormality of the positive insulation resistance RP (S200). When the insulation resistance detection system 1 determines that the negative insulation resistance RN and the positive insulation resistance RP are normal, the control unit 30 turns on the breaking unit 50 so that the battery voltage VPN can be supplied to the electric vehicle 300. On the contrary, the control unit 30 turns off the breaking unit 50 to provide a power leakage protection.

Figure 4A:
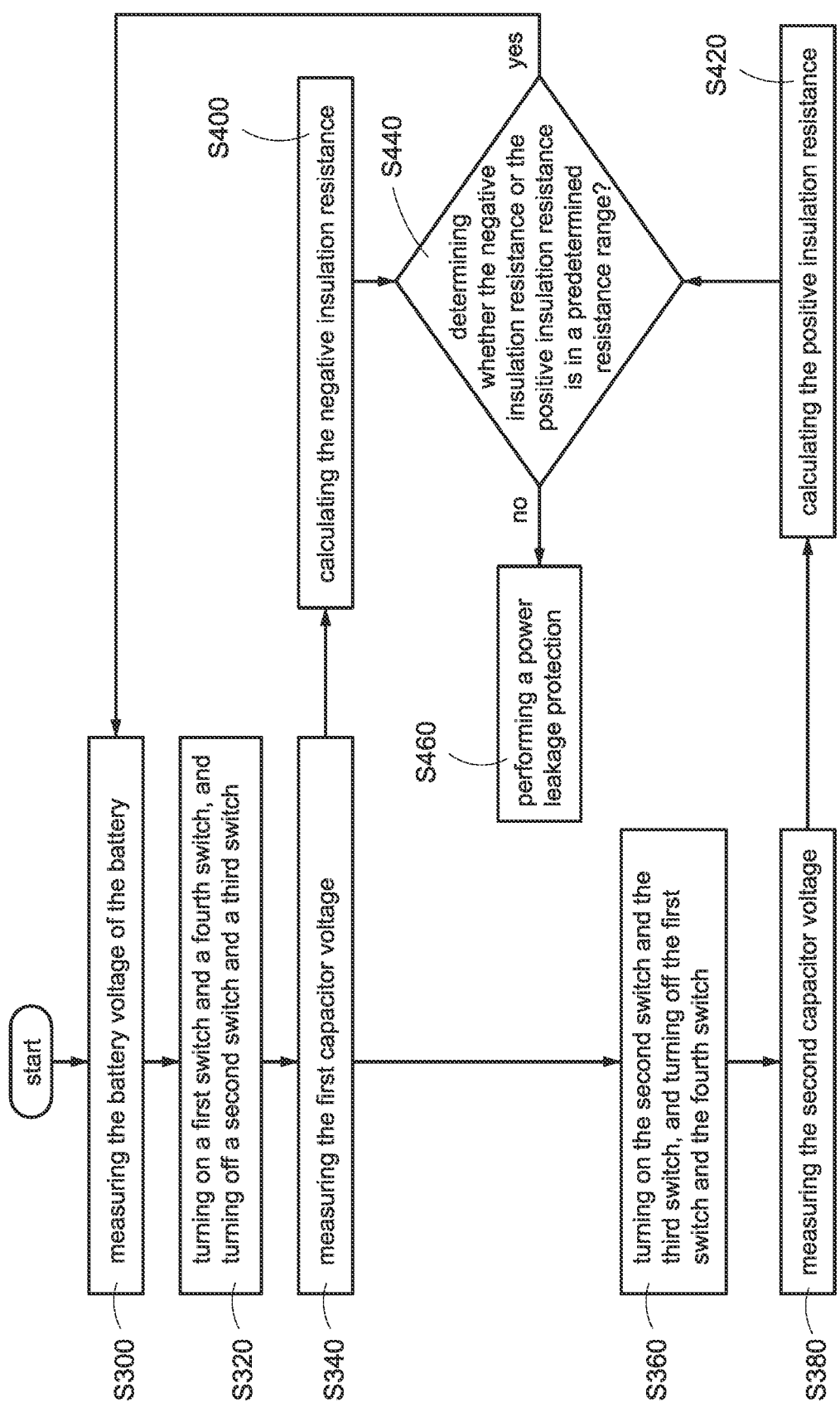
FIG. 4A is a flowchart of a method of detecting an insulation resistance according to a first embodiment of the present disclosure.

Please refer to FIG. 4A, which shows a flowchart of a method of detecting an insulation resistance according to a first embodiment of the present disclosure, and also refer to FIG. 1 to FIG. 3. The first capacitor voltage VC1 and the second capacitor voltage VC2 are used to determine whether the insulation resistances are abnormal or not. There are three embodiments are disclosed in the present disclosure. As shown in FIG. 4A, the first embodiment includes steps of: measuring the battery voltage VPN of the battery 200 (S300). Afterward, turning on the first switch S1 and the fourth switch S4, and turning off the second switch S2 and the third switch S3 (S320). When the control unit 30 controls turning on the first switch S1 and the fourth switch S4, the first capacitor C1 is charged and the second capacitor C2 is discharged. Afterward, measuring the first capacitor voltage VC1 (S340). Afterward, turning on the second switch S2 and the third switch S3, and turning off the first switch S1 and the fourth switch S4 (S360). When the control unit 30 controls turning on the second switch S2 and the third switch S3, the second capacitor C2 is charged and the first capacitor C1 is discharged. Afterward, measuring the second capacitor voltage VC2 (S380). Finally, the step (S300) is performed again for the next-cycle detection.

When the step (S340) is completed, calculating the negative insulation resistance RN (S400). The control unit 30 calculates the current negative insulation resistance RN according to the first capacitor voltage VC1 and the battery voltage VPN. In particular, the negative insulation resistance RN may be acquired by a calculation formula of charging and discharging the first capacitor C1 or by a lookup table recording the relationship between the first capacitor voltage VC1 and the battery voltage VPN. When the step (S380) is completed, calculating the positive insulation resistance RP (S420). The control unit 30 calculates the current positive insulation resistance RP according to the second capacitor voltage VC2 and the battery voltage VPN. In particular, the positive insulation resistance RP may be acquired by a calculation formula of charging and discharging the second capacitor C2 or by a lookup table recording the relationship between the second capacitor voltage VC2 and the battery voltage VPN. Afterward, determining whether the negative insulation resistance RN or the positive insulation resistance RP is in the predetermined resistance range (S440). In the step (S440), the control unit 30 determines whether the current negative insulation resistance RN calculated/acquired in step (S400) is in a first predetermined resistance range. When the current negative insulation resistance RN is not in the first predetermined resistance range, the power leakage protection is performed (S460). When the insulation resistance detection system 1 determines that the current negative insulation resistance RN is not in the first predetermined resistance range, the control unit 30 turns off the breaking unit 50 to provide the power leakage protection function. Similarly, in the step (S440), the control unit 30 determines whether the current positive insulation resistance RP calculated/acquired in step (S420) is in a second predetermined resistance range. The detail description is omitted here for conciseness.

Specifically, the setting of the first predetermined resistance range and the second predetermined resistance range may be the resistance values of the negative insulation resistance RN and the positive insulation resistance RP measured in advance when the electric vehicle 300 is well insulated, and then the resistance values are added to a positive and negative percentage to become a predetermined range. Alternatively, the resistance values of the negative insulation resistance RN and the positive insulation resistance RP are acquired by a specification table of the electric vehicle 300, and the resistance values are added to a positive and negative percentage to become a predetermined range.

Figure 4B:
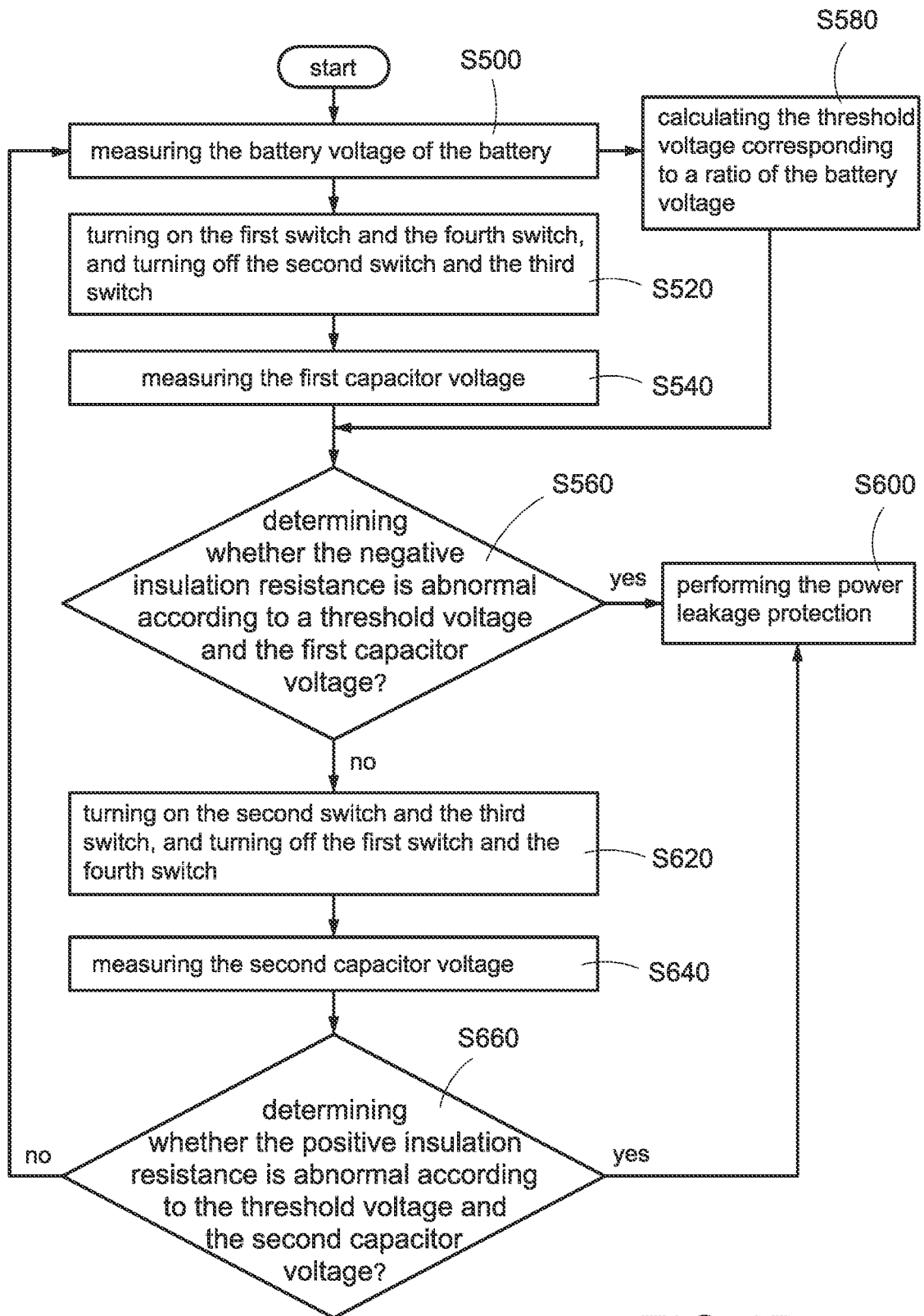
FIG. 4B is a flowchart of the method of detecting the insulation resistance according to a second embodiment of the present disclosure.

Please refer to FIG. 4B, which shows a flowchart of the method of detecting the insulation resistance according to a second embodiment of the present disclosure, and also refer to FIG. 1 to FIG. 4A. As shown in FIG. 4B, the second embodiment includes steps of: measuring the battery voltage VPN of the battery 200 (S500). Afterward, turning on the first switch S1 and the fourth switch S4, and turning off the second switch S2 and the third switch S3 (S520). When the control unit 30 turns on the first switch S1 and the fourth switch S4, and turns off the second switch S2 and the third switch S3, the first capacitor C1 is charged and the second capacitor C2 is discharged. Afterward, measuring the first capacitor voltage VC1 (S540). Afterward, determining whether the negative insulation resistance RN is abnormal according to a threshold voltage Vth and the first capacitor voltage VC1 (S560). In the step (S500), can further calculate the threshold voltage Vth corresponding to a ratio of the battery voltage VPN (S580), and providing the threshold voltage Vth to be used in the step (S560). The control unit 30 calculates the threshold voltage Vth corresponding to a ratio of (scaling down) the battery voltage VPN, and compares the threshold voltage Vth with the first capacitor voltage VC1 to determine whether the negative insulation resistance RN is abnormal. Afterward, when the control unit 30 determines that the negative insulation resistance RN is abnormal, a power protection mechanism is activated/performed (S600). When the insulation resistance detection system 1 determines that the negative insulation resistance RN is abnormal, the control unit 30 turns off the breaking unit 50 to provide power leakage protection function. In particular, the "scale down" of the battery voltage VPN is a preferred embodiment, however, it is not limited thereto, that is, the "scale up" of the battery voltage VPN may be another embodiment according to the actual requirements.

Furthermore, in the FIG. 4B, a step determines whether the insulation resistance leakage by determining whether a charging amount with a fixed charging time is sufficient to charge the capacitor voltage to the threshold voltage. The control unit 30 sets a time period between the first switch S1 being turned on and a first predetermined time as a first charging time period, and determines whether the negative insulation resistance RN is abnormal by determining whether the first capacitor voltage VC1 can be charged to the threshold voltage Vth during the first charging time period. When the first capacitor voltage VC1 can be charged to reach or exceed the threshold voltage Vth during the first charging time period, it means that the negative insulation resistance RN is abnormal, and therefore the step (S600) is performed, otherwise, the step (S620) is performed. When the negative insulation resistance RN is abnormal, the resistance value becomes too small so that the power electricity of the battery 200 passes mainly through a charging path formed by the battery 200, the first switch S1, the first capacitor C1, the negative insulation resistance RN instead of the first charge path Lc1 composed of the first current-limiting resistor REN. At this condition, the first capacitor C1 is charged faster than expected. In particular, the other steps (S620) to (S660) of FIG. 4B illustrate the detection and determination of the abnormality of the positive insulation resistance RP, which are similar to the steps (S520) to (S560), and the detail description is omitted here for conciseness. In addition, steps (S620) to (S660) and steps (S520) to (S560) can be interchanged in performing order, that is, the positive insulation resistance RP is detected earlier than the negative insulation resistance RN.

Figure 4C:
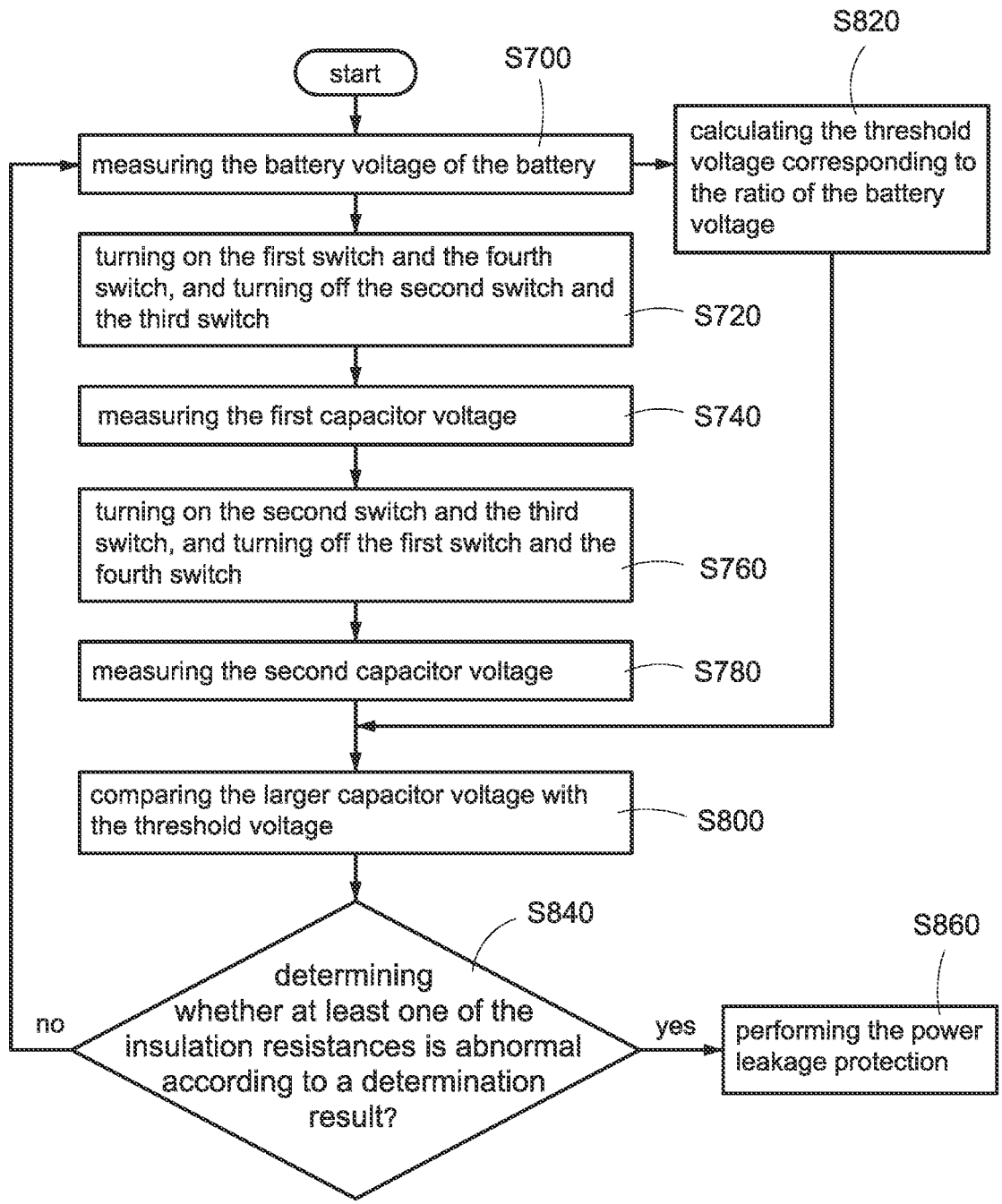
FIG. 4C is a flowchart of the method of detecting the insulation resistance according to a third embodiment of the present disclosure.

Please refer to FIG. 4C, which shows a flowchart of the method of detecting the insulation resistance according to a third embodiment of the present disclosure, and also refer to FIG. 1 to FIG. 4B. The FIG. 4C includes steps of: measuring the battery voltage VPN of the battery 200 (S700). Afterward, turning on the first switch S1 and the fourth switch S4, and turning off the second switch S2 and the third switch S3 (S720). When the control unit 30 controls turning on the first switch S1 and the fourth switch S4, and turning off the second switch S2 and the third switch S3, the first capacitor C1 is charged and the second capacitor C2 is discharged. Afterward, measuring the first capacitor voltage VC1 (S740). Afterward, turning on the second switch S2 and the third switch S3, and turning off the first switch S1 and the fourth switch S4 (S760). When the control unit 30 controls turning on the second switch S2 and third switch S3, and turning off the first switch S1 and the fourth switch S4, the second capacitor C2 is charged and the first capacitor C1 is discharged. Afterward, measuring the second capacitor voltage VC2 (S780).

Afterward, comparing the larger one of the first capacitor voltage VC1 and the second capacitor voltage VC2 with the threshold voltage Vth (S800). The control unit 30 compares a peak value of the first capacitor voltage VC1 and a peak value of the second capacitor voltage VC2 to select the larger one of the capacitor voltages VC1, VC2, and compares the larger one with the threshold voltage Vth. As the capacitor voltage has a larger peak value, it means that the corresponding insulation resistance RN or RP has a smaller resistance value, so it is more likely to have poor insulation. In the step (S700), can further calculate the threshold voltage Vth corresponding to a ratio of the battery voltage VPN (S820), and providing the threshold voltage Vth to be used in the step (S800). Afterward, determining whether at least one of the insulation resistances is abnormal (S840) according to the determination result in the step (S800). When the determination result is "YES", a power leakage protection mechanism is activated/performed (S860); when the determination result is "NO", the step (S700) is performed again for the next-cycle detection. For example, the control unit 30 selects the first capacitor voltage VC1 to compare with the threshold voltage Vth when the peak value of the first capacitor voltage VC1 is greater than the peak value of the second capacitor voltage VC2. When the first capacitor voltage VC1 is greater than the threshold voltage Vth, the control unit 30 determines that the negative insulation resistance RN is abnormal, and the step (S860) is performed, otherwise, the step (S700) is performed.

In particular, in FIG. 4A to FIG. 4C, since the battery 200 is consumed during insulation detection, the battery voltage VPN will gradually decrease, so that the battery voltage VPN and the threshold voltage Vth are not fixed values, and the threshold voltage Vth will vary with the battery voltage VPN. In addition, since the charging of the capacitor is an exponential curve, when the capacitor is close to being fully charged, the variation in the capacitor voltage is small, which is not conducive to the control unit 30 to determine the insulation resistance. Therefore, it is a preferred embodiment that the threshold voltage Vth is set at 60% to 70% of the battery voltage VPN.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. An insulation resistance detection system for an electric vehicle to detect a positive insulation resistance between a positive electrode of a battery of the electric vehicle and an equipment grounding point, and detect a negative insulation resistance between a negative electrode of the battery and the equipment grounding point, the insulation resistance detection system comprising:
a negative detection circuit coupled to the battery in parallel, and comprising a first charge and discharge circuit and a first current-limiting resistor; the first current-limiting resistor coupled between the equipment grounding point and the negative electrode; the first charge and discharge circuit comprising:
a first charge circuit comprising:
a first capacitor coupled between the positive electrode and the equipment grounding point, and
a first switch coupled between the positive electrode and the first capacitor, and
a first discharge circuit coupled to the first capacitor in parallel,
a positive detection circuit coupled to the battery in parallel, and comprising a second charge and discharge circuit and a second current-limiting resistor; the second current-limiting resistor coupled between the equipment grounding point and the positive electrode; the second charge and discharge circuit comprising:
a second charge circuit comprising:
a second capacitor coupled between the negative electrode and the equipment grounding point, and
a second switch coupled between the negative electrode and the second capacitor, and
a second discharge circuit coupled to the second capacitor in parallel, and
a control unit configured to periodically turn on the first charge circuit to charge the first capacitor, periodically turn on the first discharge circuit to discharge the first capacitor, periodically turn on the second charge circuit to charge the second capacitor, and periodically turn on the second discharge circuit to discharge the second capacitor,
wherein the first capacitor is charged to generate a first capacitor voltage, and the second capacitor is charged to generate a second capacitor voltage,
wherein the first charge circuit and the second discharge circuit are simultaneously turned on, the second charge circuit and the first discharge circuit are simultaneously turned on, and the first charge circuit and the second charge circuit are not simultaneously turned on,
wherein the control unit determines whether the negative insulation resistance is abnormal according to the first capacitor voltage and a battery voltage of the battery, and determines whether the positive insulation resistance is abnormal according to the second capacitor voltage and the battery voltage.

2. The insulation resistance detection system as claimed in claim 1,
wherein the first discharge circuit comprises:
a third switch, and
a first discharge resistor coupled to the third switch in series,
wherein when the first switch is turned on and the third switch is turned off, a first charge path composed of the battery, the first switch, the first capacitor and the first current-limiting resistor is formed to charge the first capacitor; and when the third switch is turned on and the first switch is turned off, a first discharge path composed of the first capacitor, the third switch and the first discharge resistor is formed to discharge the first capacitor; and
wherein the second discharge circuit comprises:
a fourth switch, and
a second discharge resistor coupled to the fourth switch in series,
wherein when the second switch is turned on and the fourth switch is turned off, a second charge path composed of the battery, the second switch, the second capacitor and the second current-limiting resistor is formed to charge the second capacitor; and when the fourth switch is turned on and the second switch is turned off, a second discharge path composed of the second capacitor, the fourth switch and the second discharge resistor is formed to discharge the second capacitor.

3. The insulation resistance detection system as claimed in claim 2,
- wherein a resistance value of the first current-limiting resistor is mega-ohm level and a resistance value of the first discharge resistor is kilo-ohm level so that a discharging speed of the first capacitor is higher than a charging speed of the first capacitor, and
- wherein a resistance value of the second current-limiting resistor is mega-ohm level and a resistance value of the second discharge resistor is kilo-ohm level so that a discharging speed of the second capacitor is higher than a charging speed of the second capacitor.

4. The insulation resistance detection system as claimed in claim 1, wherein the control unit provides a first control signal to control turning on or turning off the first switch, provides a second control signal to control turning on or turning off the second switch, provides a third control signal complementary to the first control signal to control turning on or turning off the first discharge circuit, and provides a fourth control signal complementary to the second control signal to control turning on or turning off the second discharge circuit;
- wherein the first control signal and the second control signal are complementary to each other, and a time period of turning on and a time period of turning off are the same.

5. The insulation resistance detection system as claimed in claim 1, further comprising:
- a breaking unit coupled to the battery and the electric vehicle,
- wherein the control unit turns off the breaking unit according to an abnormality of the negative insulation resistance or an abnormality of the positive insulation resistance so that a path between the battery and the electric vehicle is disconnected.

6. An insulation resistance detection method for an electric vehicle, adapting an insulation resistance detection system used to detect a positive insulation resistance between a positive electrode of a battery of the electric vehicle and an equipment grounding point, and detect a negative insulation resistance between a negative electrode of the battery and the equipment grounding point, the insulation resistance detection system comprising a negative detection circuit and a positive detection circuit, the negative detection circuit comprising a first capacitor and the positive detection circuit comprising a second capacitor, the insulation resistance detection method comprising steps of:
- measuring a battery voltage of the battery, and calculating a threshold voltage according to a ratio of the battery voltage,
- periodically charging and discharging the first capacitor to acquire a first capacitor voltage of the first capacitor while charging the first capacitor,
- periodically charging and discharging the second capacitor to acquire a second capacitor voltage of the second capacitor while charging the second capacitor,
- wherein periodically charging and discharging the first capacitor and the second capacitor comprising steps of:
- simultaneously discharging the second capacitor while charging the first capacitor, and
- simultaneously charging the second capacitor while discharging the first capacitor, wherein a time period of charging and a time period of discharging are the same,
- comparing the first capacitor voltage and the threshold voltage, and when determining that the negative insulation resistance is less than a first predetermined resistance range according to the comparison of the first capacitor voltage and the battery voltage to determine that the negative insulation resistance is abnormal, and
- comparing the second capacitor voltage and the threshold voltage, and when determining that the positive insulation resistance is less than a second predetermined resistance range according to the comparison of the second capacitor voltage and the battery voltage to determine that the positive insulation resistance is abnormal.

7. The insulation resistance detection method as claimed in claim 6, further comprising steps of:
- determining that the negative insulation resistance is less than the first predetermined resistance range according to the first capacitor voltage reaching the threshold voltage to determine that the negative insulation resistance is abnormal, and
- determining that the positive insulation resistance is less than the second predetermined resistance range according to the second capacitor voltage reaching the threshold voltage to determine that the positive insulation resistance is abnormal.

8. The insulation resistance detection method as claimed in claim 7, further comprising steps of:
- determining that the negative insulation resistance is abnormal when the first capacitor voltage of the first capacitor is charged to reach the threshold voltage within a first charge time period, and
- determining that the positive insulation resistance is abnormal when the second capacitor voltage of the second capacitor is charged to reach the threshold voltage within a second charge time period.

9. The insulation resistance detection method as claimed in claim 7, further comprising steps of:
- comparing a larger one of a peak value of the first capacitor voltage and a peak value of the second capacitor voltage with the threshold voltage, and
- determining that at least one of the negative insulation resistance and the positive insulation resistance is abnormal to perform a protection mechanism when the capacitor voltage corresponding to the larger peak value is greater than the threshold voltage.

10. The insulation resistance detection method as claimed in claim 7, wherein the ratio is between 60% to 70%.

* * * * *